(12) United States Patent
Chou

(10) Patent No.: US 8,238,139 B2
(45) Date of Patent: Aug. 7, 2012

(54) DYNAMIC RANDOM ACCESS MEMORY AND METHOD OF DRIVING DYNAMIC RANDOM ACCESS MEMORY

(75) Inventor: Min-Chung Chou, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 205 days.

(21) Appl. No.: 12/748,453

(22) Filed: Mar. 29, 2010

(65) Prior Publication Data
US 2011/0235451 A1    Sep. 29, 2011

(51) Int. Cl.
G11C 11/4063    (2006.01)
G11C 11/4074    (2006.01)
G11C 11/409    (2006.01)
G11C 11/4096    (2006.01)

(52) U.S. Cl. ............... 365/149; 365/226; 365/233.17; 365/189.15; 365/189.09; 365/189.11; 365/205

(58) Field of Classification Search ............ 365/149, 365/226, 205, 189.09, 189.11, 189.15, 233.17
See application file for complete search history.

(56) References Cited

U.S. PATENT DOCUMENTS

| | | | | |
|---|---|---|---|---|
| 6,034,914 A | * | 3/2000 | Inaba et al. | 365/230.06 |
| 6,600,342 B1 | * | 7/2003 | Lee et al. | 326/105 |
| 6,944,069 B2 | * | 9/2005 | Kim et al. | 365/191 |
| 7,372,766 B2 | * | 5/2008 | Park et al. | 365/230.06 |
| 2006/0087896 A1 | | 4/2006 | Brox et al. | |
| 2007/0036008 A1 | * | 2/2007 | Park et al. | 365/189.09 |
| 2009/0147596 A1 | | 6/2009 | Shiah | |

* cited by examiner

Primary Examiner — J. H. Hur
(74) Attorney, Agent, or Firm — Jianq Chyun IP Office

(57) ABSTRACT

A dynamic RAM which includes a first inverter, a second inverter, a sense amplifier, a first pair of switches, a pair of bit lines, and a dynamic RAM cell. The first inverter receives a first driving signal. A power end of the first inverter is coupled to a first voltage source. The second inverter receives a second driving signal output from the first inverter. A power end of the second inverter is coupled to a second voltage source. The sense amplifier senses and amplifies a voltage difference between a first sensing signal and a second sensing signal. A power end of the sense amplifier is coupled to a third voltage source, wherein a voltage value of the second voltage source is between a voltage value of the first voltage source and a voltage value of the third voltage source.

8 Claims, 2 Drawing Sheets

DYNAMIC RANDOM ACCESS MEMORY AND METHOD OF DRIVING DYNAMIC RANDOM ACCESS MEMORY

BACKGROUND OF THE INVENTION

1. Field of the Invention

The invention relates to storage apparatus, and more particularly to a dynamic random access memory and a method of driving dynamic random access memory.

2. Description of Related Art

Memory is used to store the information. For recent years, the requirement of the memory is more and more demanding. The basic function for a memory includes "read" and "write". Memory can be categorized into two groups: read only memory (ROM) and random access memory (RAM), such as dynamic random access memory (dynamic RAM, or DRAM).

A bit stored in a memory cell is read by using the data lines, bit lines, the cell, a column decoder, and a sense amplifier. The column decoder includes a plurality of bit switch transistors, each transistor connecting different data line to the input of the sense amplifier. The bit switch transistors are used as switches to transceive the data from the data lines to the sense amplifier. In a read operation, the driving signal is applied to the bit switches, and the bit stored in a memory cell is read through the bit lines and the sense amplifier to the data lines. In a write operation, the driving signal drives the bit switches to allow the data in the data lines to be applied as the inputs to the sense amplifier. The sense amplifier further transmits the data to be stored to the memory cell.

SUMMARY OF THE INVENTION

The invention provides a dynamic RAM which includes a first inverter, a second inverter, a sense amplifier, a first pair of switches, a pair of bit lines, and a dynamic RAM cell. The first inverter receives a first driving signal. A power end of the first inverter is coupled to a first voltage source. The second inverter receives a second driving signal output from the first inverter. A power end of the second inverter is coupled to a second voltage source. The sense amplifier senses and amplifies a voltage difference between a first sensing signal and a second sensing signal. A power end of the sense amplifier is coupled to a third voltage source. Wherein a voltage value of the second voltage source is between a voltage value of the first voltage source and a voltage value of the third voltage source. The first pair of switches is controlled by a third driving signal output from the second inverter. Two ends on one side of the first pair of switches are respectively coupled to a pair of data lines. Two ends on the other side of the first pair of switches are coupled to the sense amplifier to transceive the first sensing signal and the second sensing signal. The dynamic RAM cell stores a data value. The data value stored in the dynamic RAM cell is read or overwritten by the pair of the bit lines and a word line.

According to an embodiment of the invention, the dynamic RAM further includes a second pair of switches. The second pair of switches is controlled by an isolation signal. Two ends on one side of the second pair of switches are respectively coupled to the pair of bit lines. Two ends on the other side of the second pair of switches are coupled to the sense amplifier to transceive the first sensing signal and the second sensing signal.

According to an embodiment of the invention, the first pair of switches includes a first pair of transistors. The gates thereof receive the third driving signal. The sources thereof are respectively coupled to the pair of data lines. The drains thereof are coupled to the sense amplifier to transceive the first sensing signal and the second sensing signal.

According to an embodiment of the invention, the second pair of switches includes a second pair of transistors. The gates thereof receive the isolation signal. The drains thereof are respectively coupled to the pair of bit lines. The sources thereof are coupled to the sense amplifier to transceive the first sensing signal and the second sensing signal.

According to an embodiment of the invention, the dynamic RAM cell includes an access transistor and a capacitor.

According to an embodiment of the invention, the gate of the access transistor is coupled to the word line. The drain of the access transistor is coupled to one of the pair of bit lines. The source of the access transistor is coupled to a first node of the capacitor. A second node of the capacitor is coupled to a fourth voltage source.

According to an embodiment of the invention, a voltage value of the fourth voltage source is half of the voltage value of the third voltage source.

The invention provides a method of driving a dynamic RAM, wherein the dynamic RAM includes a first inverter, a second inverter, a sense amplifier, a first pair of switches, a pair of data lines, and a dynamic RAM cell. The first inverter and the second inverter are coupled in series to drive the first pair of switches. The sense amplifier is coupled to the pair of data lines through the first pair of switches and to the dynamic RAM cell. The method of driving a dynamic RAM includes three steps. One step of the method is providing a first voltage source to apply a first voltage to a power end of the first inverter. Another step of the method is providing a second voltage source to apply a second voltage to a power end of the second inverter. Another step of the method is providing a third voltage source to apply a power end of the third voltage to a sense amplifier. Wherein a voltage value of the second voltage source is between a voltage value of the first voltage source and a voltage value of the third voltage source.

With such configuration, a dynamic random access memory and a method of driving dynamic random access memory are provided. The DRAM does not suffer low operation speed due to the voltage value of the second voltage source being set to the lower voltage value of the first voltage source and the third voltage source. Moreover, the DRAM neither suffers instability due to the voltage value of the second voltage source being set to the higher voltage value of the third voltage source and the first voltage source. The DRAM has a better beta ratio for the sense amplifier to operate in good speed and with stability thanks to suitable range of the voltage value of the second voltage source.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
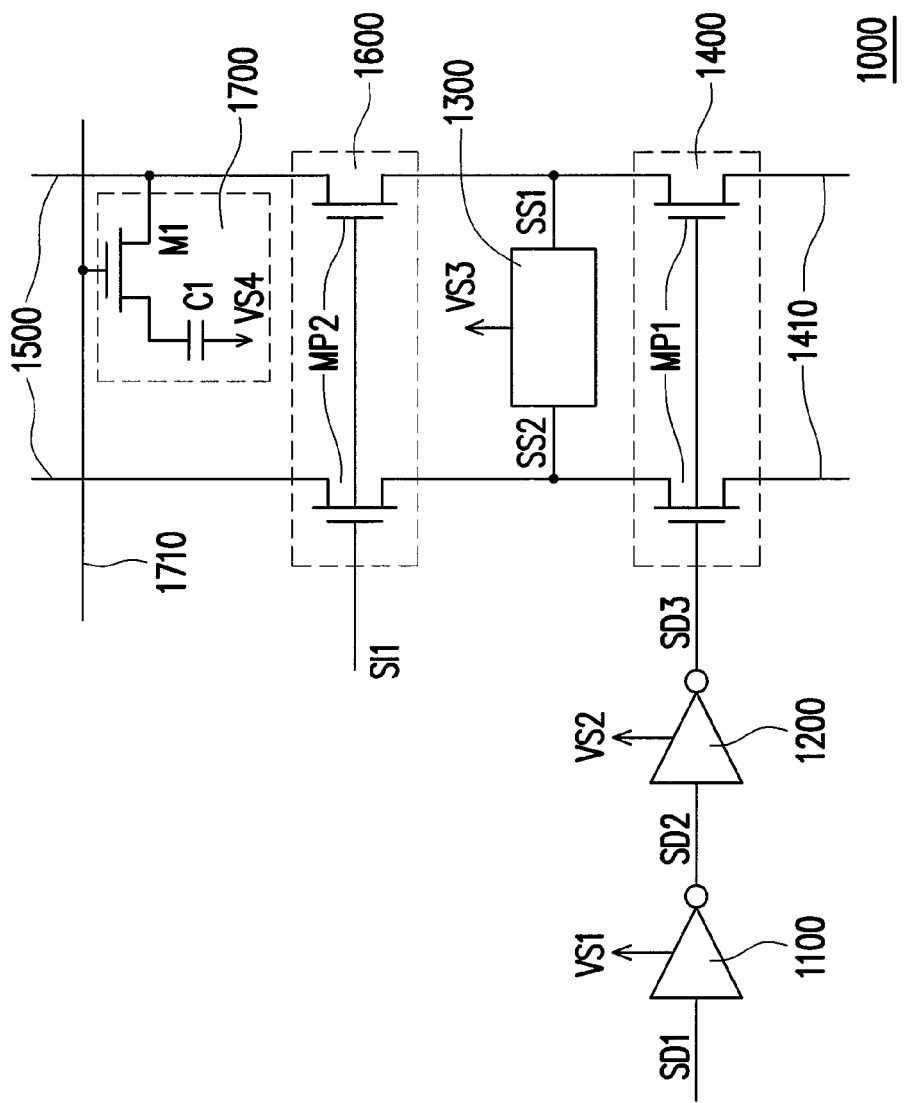
FIG. 1 shows a block diagram of a dynamic RAM according to the embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 shows a block diagram of a dynamic RAM according to the embodiment of the invention. Referring to FIG. 1, a dynamic RAM (DRAM) 1000 includes a first inverter 1100, a second inverter 1200, a sense amplifier 1300, a first pair of switches 1400, a pair of bit lines 1500, and a dynamic RAM cell 1700.

The first inverter 1100 receives a first driving signal SD1. A power end of the first inverter 1100 is coupled to a first voltage source VS1. The second inverter 1200 receives a second driving signal SD2 output from the first inverter 1100. A power end of the second inverter 1200 is coupled to a second voltage source VS2. The sense amplifier 1300 senses and amplifies a voltage difference between a first sensing signal SS1 and a second sensing signal SS2, and a power end of the sense amplifier 1300 is coupled to a third voltage source VS3.

The first pair of switches 1400 is controlled by a third driving signal SD3 output from the second inverter 1200. Two ends on one side of the first pair of switches 1400 are respectively coupled to a pair of data lines 1410. Two ends on the other side of the first pair of switches 1400 are coupled to the sense amplifier 1300 to transceive the first sensing signal SS1 and the second sensing signal SS2. The dynamic RAM cell 1700 stores a data value. The data value stored in the dynamic RAM cell 1700 is read or overwritten by the pair of the bit lines 1500 and a word line 1710.

In the embodiment, the voltage value of the second voltage source VS2 is between the voltage value of the first voltage source VS1 and the voltage value of the third voltage source VS3. Therefore, the DRAM 1000 does not suffer low operation speed due to the voltage value of the second voltage source VS2 being set to the lower voltage value of the first voltage source VS1 and the third voltage source VS3. Moreover, the DRAM 1000 neither suffers instability due to the voltage value of the second voltage source VS2 being set to the higher voltage value of the third voltage source VS3 and the first voltage source VS1. The DRAM 1000 has a better beta ratio for the sense amplifier 1300 to operate in good speed and with stability thanks to suitable range of the voltage value of the second voltage source VS2.

In addition, the DRAM 1000 may further include a second pair of switches 1600. The second pair of switches 1600 is controlled by an isolation signal SI1. Two ends on one side of the second pair of switches 1600 are respectively coupled to the pair of bit lines 1500. Two ends on the other side of the second pair of switches 1600 are coupled to the sense amplifier 1300 to transceive the first sensing signal SS1 and the second sensing signal SS2.

Additionally, the first pair of switches 1400 includes a first pair of transistors MP1. The gates of the first pair of transistors MP1 receive the third driving signal SD3. The sources of the first pair of transistors MP1 are respectively coupled to the pair of data lines 1410. The drains of the first pair of transistors MP1 are coupled to the sense amplifier 1300 to transceive the first sensing signal SS1 and the second sensing signal SS2.

The second pair of switches 1600 includes a second pair of transistors MP2. The gates of the second pair of transistors MP2 receive the isolation signal SI1. The drains of the second pair of transistors MP2 are respectively coupled to the pair of bit lines 1500. The sources of the second pair of transistors MP2 are coupled to the sense amplifier 1300 to transceive the first sensing signal SS1 and the second sensing signal SS2.

In the embodiment, the dynamic RAM cell 1700 includes an access transistor M1 and a capacitor C1. In the embodiment, the gate of the access transistor M1 is coupled to the word line 1710. The drain of the access transistor M1 is coupled to one of the pair of bit lines 1500. The source of the access transistor M1 is coupled to a first node of the capacitor C1. A second node of the capacitor C1 is coupled to a fourth voltage source VS4. In addition, the voltage value of the fourth voltage source may be half of the voltage value of the third voltage source.

Figure 2:
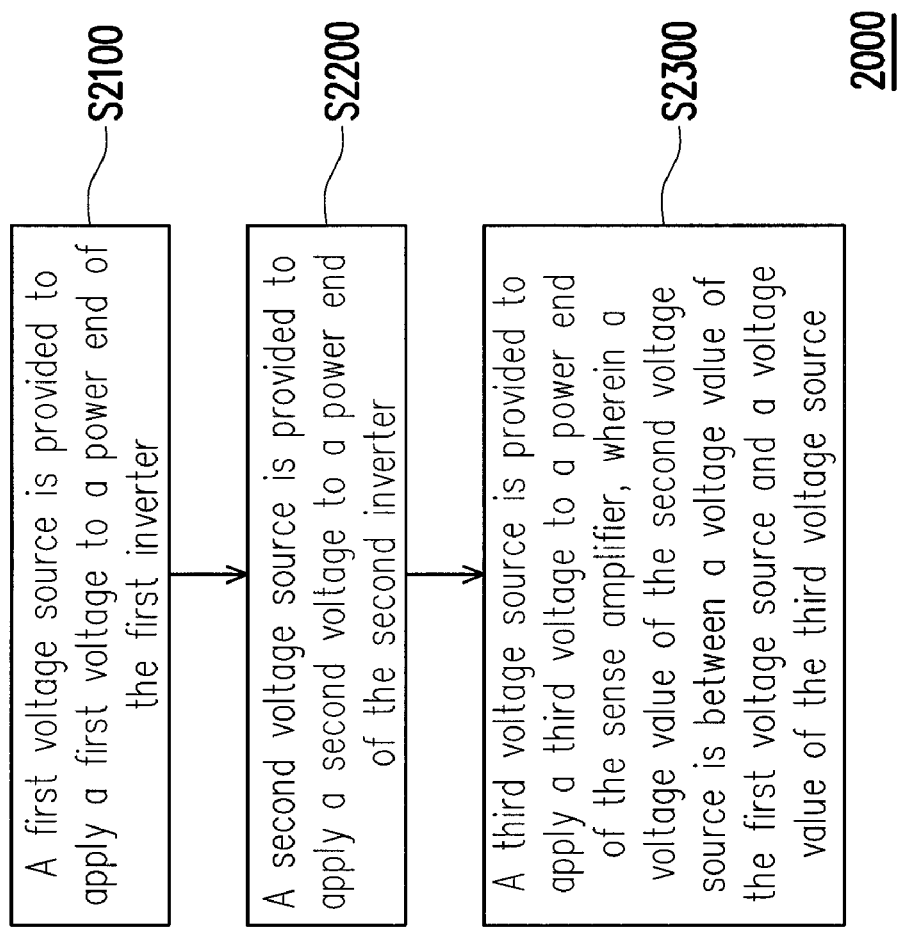
FIG. 2 shows a flow diagram of driving a dynamic RAM according to the embodiment of the invention.

FIG. 2 shows a flow diagram of a method of driving a dynamic RAM according to the embodiment of the invention. The dynamic RAM includes a first inverter, a second inverter, a sense amplifier, a first pair of switches, a pair of data lines, and a dynamic RAM cell. The first inverter and the second inverter are coupled in series to drive the first pair of switches. The sense amplifier is coupled to the pair of data lines through the first pair of switches and to the dynamic RAM cell. Referring to FIG. 2, the method 2000 of driving a dynamic RAM includes steps S2100~S2300. In the step S2100, a first voltage source is provided to apply a first voltage to a power end of the first inverter. In the step S2200, a second voltage source is provided to apply a second voltage to a power end of the second inverter. In the step S2300, a third voltage source is provided to apply a third voltage to a power end of the sense amplifier. Wherein a voltage value of the second voltage source is between a voltage value of the first voltage source and a voltage value of the third voltage source.

For example, the voltage value of the first voltage source may be 1.8 Volt, the voltage value of the third voltage source may be 1 Volt, and therefore the voltage value of the second voltage source may be 1.5 Volt. However, it is noted that the voltage values of the first, second, and third voltage source are not limited thereto, but they must satisfy the condition "a voltage value of the second voltage source is between a voltage value of the first voltage source and a voltage value of the third voltage source".

The DRAM does not suffer low operation speed due to the voltage value of the second voltage source being set to the lower voltage value of the first voltage source and the third voltage source. Moreover, the DRAM neither suffers instability due to the voltage value of the second voltage source being set to the higher voltage value of the third voltage source and the first voltage source. The DRAM has a better beta ratio for the sense amplifier to operate in good speed and with stability thanks to suitable range of the voltage value of the second voltage source.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dynamic RAM, comprising:
    a first inverter, receiving a first driving signal, a positive power end of the first inverter is coupled to a first voltage source;
    a second inverter, receiving a second driving signal output from the first inverter, a positive power end of the second inverter is coupled to a second voltage source;
    a sense amplifier, sensing and amplifying a voltage difference between a first sensing signal and a second sensing signal, a positive power end of the sense amplifier is coupled to a third voltage source for receiving the third voltage source directly, wherein a voltage value of the second voltage source is between a voltage value of the first voltage source and a voltage value of the third voltage source;

a first pair of switches, controlled by a third driving signal output from the second inverter, two ends on one side of the first pair of switches are respectively coupled to a pair of data lines, two ends on the other side of the first pair of switches are coupled to the sense amplifier to transceive the first sensing signal and the second sensing signal;

a pair of bit lines; and a dynamic RAM cell, storing a data value, the data value stored in the dynamic RAM cell is read or overwritten by the pair of the bit lines and a word line.

2. The dynamic RAM of claim 1, wherein the first pair of switches comprises a first pair of transistors, the gates thereof receive the third driving signal, the sources thereof are respectively coupled to the pair of data lines, the drains thereof are coupled to the sense amplifier to transceive the first sensing signal and the second sensing signal.

3. The dynamic RAM of claim 1, further comprising:

a second pair of switches, controlled by an isolation signal, wherein two ends on one side of the second pair of switches are respectively coupled to the pair of bit lines, two ends on the other side of the second pair of switches are coupled to the sense amplifier to transceive the first sensing signal and the second sensing signal.

4. The dynamic RAM of claim 3, wherein the second pair of switches comprises a second pair of transistors, the gates thereof receive the isolation signal, the drains thereof are respectively coupled to the pair of bit lines, the sources thereof are coupled to the sense amplifier to transceive the first sensing signal and the second sensing signal.

5. The dynamic RAM of claim 4, wherein the dynamic RAM cell comprises an access transistor and a capacitor.

6. The dynamic RAM of claim 5, wherein the gate of the access transistor is coupled to the word line, the drain of the access transistor is coupled to one of the pair of bit lines, the source of the access transistor is coupled to a first node of the capacitor, a second node of the capacitor is coupled to a fourth voltage source.

7. The dynamic RAM of claim 6, wherein a voltage value of the fourth voltage source is half of the voltage value of the third voltage source.

8. A method of driving a dynamic RAM, wherein the dynamic RAM comprises a first inverter, a second inverter, a sense amplifier, a first pair of switches, a pair of data lines, and a dynamic RAM cell, the first inverter and the second inverter are coupled in series to drive the first pair of switches, the sense amplifier is coupled to the pair of data lines through the first pair of switches and to the dynamic RAM cell, the method comprises:

providing a first voltage source to apply a first voltage to a positive power end of the first inverter;

providing a second voltage source to apply a second voltage to a positive power end of the second inverter; and providing a third voltage source to directly apply a third voltage to a positive power end of the sense amplifier, wherein a voltage value of the second voltage source is between a voltage value of the first voltage source and a voltage value of the third voltage source.

* * * * *